United States Patent [19]

Heaps

[11] Patent Number: 4,901,315
[45] Date of Patent: Feb. 13, 1990

[54] INTEGRATED DATA AND TIMING CIRCUITRY FOR AUTOMATIC CIRCUIT TESTER

[75] Inventor: William Ian Heaps, Stockport, England

[73] Assignee: GenRad, Ltd., Cheshire, England

[21] Appl. No.: 177,067

[22] Filed: Apr. 4, 1988

[51] Int. Cl.$^4$ .............................................. G06F 11/00
[52] U.S. Cl. ...................................................... 371/27
[58] Field of Search ............................ 371/27, 25, 15; 324/73 R, 73 AT; 364/200 MS File

[56] References Cited

U.S. PATENT DOCUMENTS

| | | | |
|---|---|---|---|
| 4,450,560 | 5/1984 | Conner | 371/27 X |
| 4,451,918 | 5/1984 | Gillette | 371/27 |
| 4,517,661 | 5/1985 | Graf | 371/27 X |
| 4,730,318 | 3/1988 | Bogholtz | 371/27 |
| 4,788,684 | 11/1988 | Kawaguchi | 371/27 X |
| 4,806,852 | 2/1989 | Swan | 371/27 X |

Primary Examiner—Jerry Smith
Assistant Examiner—Robert W. Beausoliel
Attorney, Agent, or Firm—Nutter, McClennen & Fish

[57] ABSTRACT

An automatic circuit tester (10) applies signals to tester terminals (12a, b, and c) by means of corresponding data channels (14a, b and c). Each channel includes a leading-edge memory 18 and a trailing-edge memory 20 that provide outputs of successive locations upon the occurrences of clock pulses applied by a clock 16 through respective phase shifters (22 and 24). A formatter (26) applies signals in accordance with the outputs of the memories (18 and 20) with a timing format determined directly by the times at which the memory outputs occur; no separate timing information is required by the formatters. The timing results from the phase shifts imposed by phase shifters 22 and 24 and by transitions in the contents of a plurality of successive memory locations provided for each period of the device under test.

2 Claims, 2 Drawing Sheets

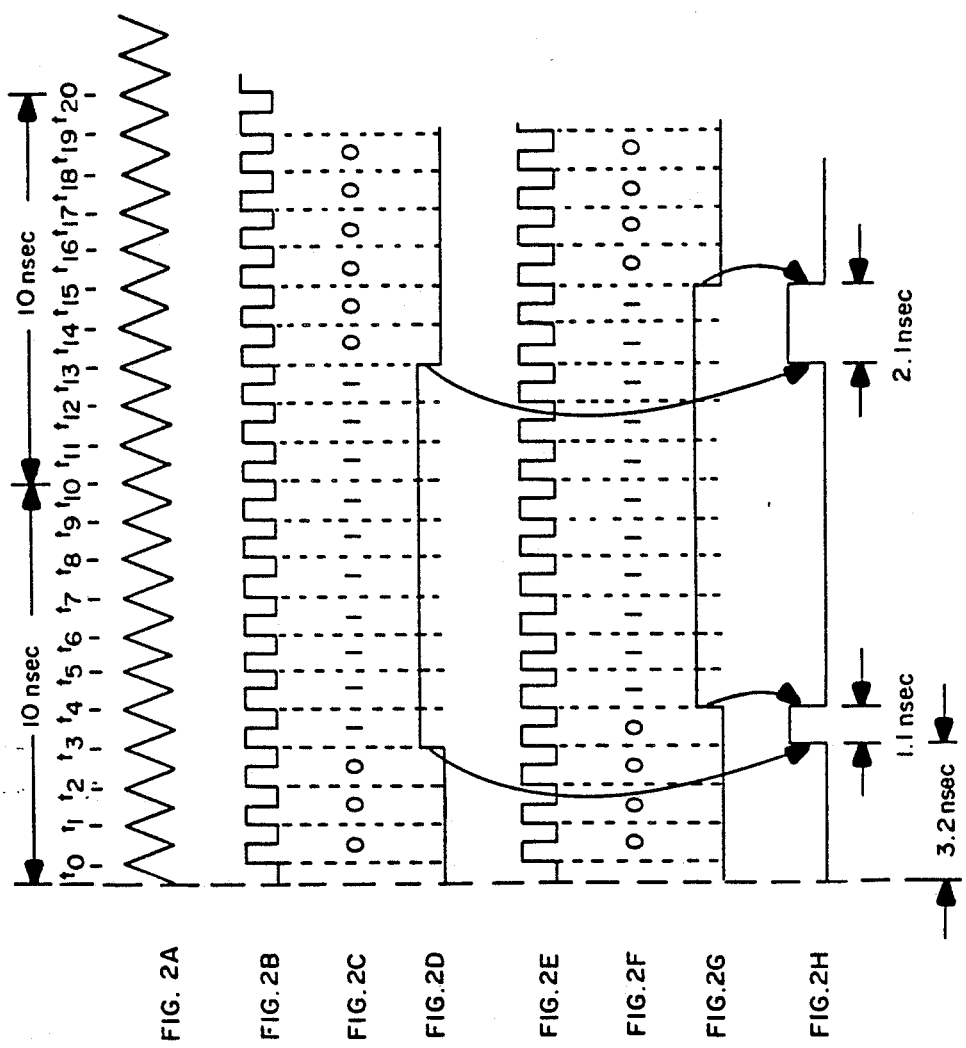

INTEGRATED DATA AND TIMING CIRCUITRY FOR AUTOMATIC CIRCUIT TESTER

BACKGROUND OF THE INVENTION

The present invention is directed to automatic circuit testing and particularly to the data and timing circuits for such testers.

The operation of automatic circuit testers can be thought of as the application, at some clock rate, of vectors to a group of nodes in a device under test. A "vector" is the ordered list of the binary values to be applied to all of the nodes within a clock period of the tester. Applied in this case can mean either impressing upon a node the particular binary value or testing the node for that value. There are very many performance criteria for automatic circuit testers, but the major performance criteria are the number of nodes that a tester can test simultaneously and the speed at which it can apply vectors to those nodes. The latter criterion, namely, speed, is the one to which the present invention is directed.

As the speed of integrated circuits has increased, so has the speed requirements of the testers used to test them. However, it has now become apparent that testers of conventional architecture have significant speed limitations. A large part of this limitation stems from the complexity exhibited by conventional tester architecture. Tester architectures differ, but the typical tester includes a large memory device for each tester terminal, or "pin." Each location in the memory contains the data to be applied to the tester terminal at a different clock period.

Also included in the typical pin electronics is a formatter, which translates the memory data either into signals applied to the tester pin (driving) or into comparisons made with the signals present on the tester pin (sensing). For proper operation, the pin electronics further requires timing information. The memories contain the data to be applied to the tester terminals within a given clock period, while the timing information indicates when, within a clock period, the data are to be applied. The formatter converts the data and the timing information into a signal of the proper value having the proper timing within a clock period.

The circuitry for performing this conversion varies greatly from tester to tester, but it typically is fairly complex and includes counters, programmable delay lines, or combinations of these. At the high data rates required of modern testers, it is difficult to arrange all the circuitry so that various signals track each other accurately, and this difficulty increases with speed so as ultimately to place a limitation on the speed at which a tester can operate.

SUMMARY OF THE INVENTION

According to the present invention, much of this complexity is avoided by placing both the data and the timing information in the same memories. Specifically, I employ, for each channel, a leading-edge memory and a trailing-edge memory, which are clocked by respective individually delayed versions of a master clock signal. That is, I provide a programmable delay line for the leading-edge-memory clock signal and a separate programmable delay line for the trailing-edge-memory clock signal. I then apply signals to the tester terminals at times determined totally by the times of occurrence of the outputs of the leading-edge and trailing-edge memories. In this way, I employ no separate timing information, and the complexity required to combine data and timing information is eliminated.

BRIEF DESCRIPTION OF THE DRAWINGS

These and further features and advantages of the present invention are described in connection with the accompanying drawings, in which:

FIGS. 2A–2H represent a diagram depicting the contents of the leading-edge and trailing-edge memories and of the tester-terminal signals that result.

DETAILED DESCRIPTION OF THE PREFERRED EMBODIMENT

Figure 1:
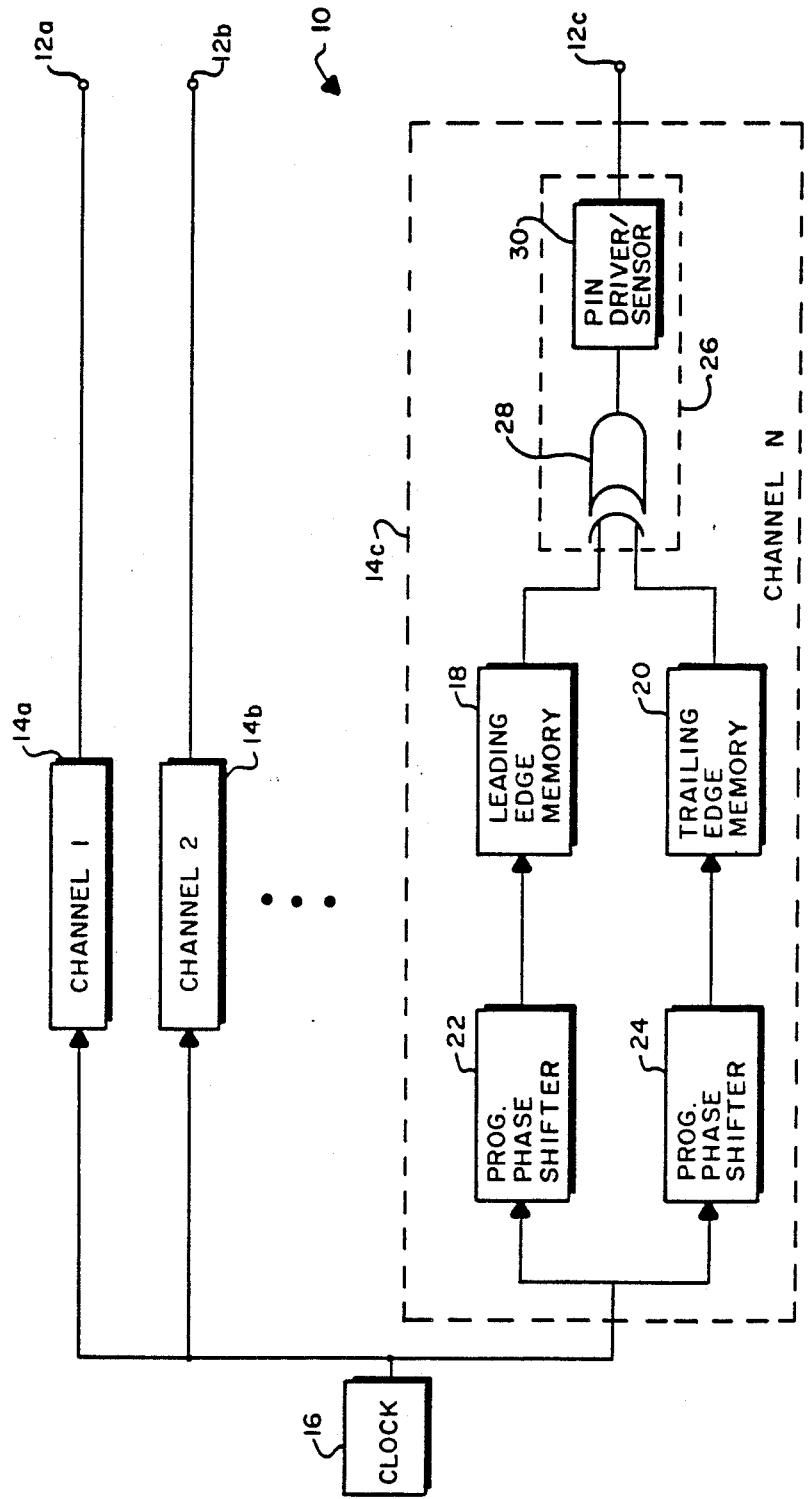
FIG. 1 is a block diagram of the data/timing circuitry of a tester employing the teachings of the present invention.

FIG. 1 depicts a portion of an automatic circuit tester 10. The tester 10 is a device for driving or sensing circuit nodes connected to a multiplicity of tester pins such as pins 12a, 12b, and 12c of FIG. 1. The information for driving or sensing the pins is applied to them through channels 14a, 14b, and 14c in response to timing signals provided by a common master clock 16. Preferably, clock 16 is a synthesized-frequency device, which generates a selectable high frequency. Such circuits enable the clock frequency to be chosen with a high resolution.

Each channel includes a leading-edge memory 18 and a trailing-edge memory 20, which receive individual clock signals consisting of individually phase-shifted versions of the master clock signal produced by clock 16. For this purpose, delay lines in the forms of programmable phase shifters 22 and 24 are provided for the leading-edge and trailing-edge memories 18 and 20, respectively. The outputs of the leading-edge and trailing-edge memories are applied to a simple formatter 26, which transforms the memory outputs with no further timing adjustment to drive or sense signals at terminal 12c.

The formatter is depicted as an exclusive-OR (XOR) gate 28 and a pin driver/sensor 30. The XOR gate receives as inputs the outputs of memories 18 and 20 and applies its own output to the pin driver/sensor 30. The driver/sensor 30 act in either a driver mode or a sensor mode. When it is in its driver mode, it merely drives the node connected to terminal 12c with one of two programmed levels in accordance with the binary output of the XOR gate 28. In the sensor mode, the driver/sensor 30 compares the signal on terminal 12c with a level determined by the binary output of XOR gate 28 and transmits the result of the comparison to test-system circuitry not shown in the drawings. For the remainder of the description, it will be assumed that driver/sensor 30 is operating in its driver mode.

A distinguishing feature of the circuitry depicted in FIG. 1 is that the leading-edge memory 18 and trailing-edge memory 20 contain not only the data information but also, with the aid of their respective phase shifters 22 and 24, the timing information required for tester operation. To understand this feature it is first necessary to recall conventional tester operation.

A circuit tester for complex integrated circuits and circuit boards tests a device under test ("DUT")—namely, a complex integrated circuit board—that operates with a basic DUT clock period. That is, in its normal operation, the signal at any DUT node does one of only three things: it changes its level once, or changes its level once and then returns to its initial level during one clock period, or does not change its level at all; no more activity than that occurs at any node during a single clock period. This clock period typically is established by a signal at a clock terminal, which signal may be the only exception to the foregoing rule.

To test such a DUT, the conventional tester can be thought of conceptually as containing one bit of data per terminal per clock period. This is actually a simplification because, in addition to a single bit to indicate whether the intended level is high or low, the tester typically also requires a further bit to cover the possibility that the node is to be presented with a high impedance in the driving mode or that the tester "doesn't care" what the signal is in the sensing mode. For present purposes, however, we will consider the conventional pin memory to include only a single bit for each terminal for each DUT period.

In addition to the data information, a conventional tester also requires "time set" information, which defines the point within the DUT period at which the data should be applied. The time-set information is applied to the conventional-tester formatter along with the data information, and the formatter then applies the signal thus specified. The complexity of responding to this time-set information contributes to the speed limitations of conventional testers.

In contrast, the formatter 26 of the present invention receives only the signals from the leading-edge memory 18 and the trailing-edge memory 20; it does not receive separate signals that specify when, within the DUT clock period, the levels indicated by those signals are to be applied. Instead, the times at which the levels are applied are determined by the times of transitions in the outputs of memories 18 and 20.

Two factors determine the timing of these transitions. The fine adjustment of this timing is made by the settings of programmable phase shifters 22 and 24. Within a signal burst—that is, within a sequence of vectors to be applied at an uninterrupted DUT clock rate—the settings of the programmable phase shifters 22 and 24 are fixed, although they can be changed between bursts.

In many cases, a coarse adjustment is achieved by the contents of the leading-edge and trailing-edge memories, and it thus can change from DUT clock period to DUT clock period. The manner in which this adjustment is achieved will now be described by reference to FIG. 2.

We will assume that the DUT is a 100-MHz chip; that is, the DUT period is 10 nsec. To test the chip, the tester clock 16 is set, not at 100 MHz, but rather at 1 GHz; that is, the tester clock period is 1 nsec. rather than 10 nsec. The clock 16 will thus cause a new output from the leading-edge and trailing-edge memories 18 and 20 once every nanosecond. Of course, the access times of the actual memory chips that comprise leading-edge memory 18 and trailing-edge memory 20 are considerably longer than one nanosecond, but those skilled in the art will recognize that, by employing pipelining techniques, the effective access time for the memory circuits 18 and 20 can be made to be one nanosecond if the order in which they are retrieved is predetermined.

FIG. 2A depicts two DUT periods of the master clock signal. The positive-going zero crossings of the master clock define the beginning of one-nanosecond tester clock signals. There are ten tester clock periods in a DUT clock period, as FIG. 2A indicates, and two successive DUT periods start at $t_0$ and $t_{10}$.

In the absence of the phase shifters 22 and 24, the times at which new outputs from the leading-edge and trailing-edge memories 18 and 20 appear would coincide with the master-clock zero crossings. However, in the timing example depicted in FIGS. 2A–H, programmable phase shifter 22 is set to provide a 200-psec. delay, while phase shifter 24 is programmed to provide a 300-psec. delay. Consequently, the output of phase shifter 22 after hard limiting, depicted in FIG. 2B, is delayed from the zero crossings of the master clock signal in FIG. 2A.

FIG. 2C lists the contents of the leading-edge-memory locations that determine the successive outputs caused by the low-to-high transitions of the individual clock signal depicted in FIG. 2B, and FIG. 2D depicts the resultant output of the leading-edge memory 18.

FIG. 2E is a diagram similar to FIG. 2B but depicting the output of programmable phase shifter 24 rather than that of phase shifter 22. Phase shifter 24 is set for a delay of 300 psec. rather than the 200 psec. for which phase shifter 22 is programmed. FIGS. 2F and 2G depict the contents and outputs of trailing edge memory 22 just as FIGS. 2C and 2D depict those of the leading-edge memory 18.

FIG. 2H depicts the output of XOR gate 28 in response to the outputs of the leading-edge memory 18 and trailing-edge memory 20, and it shows that the first pulse is 1.1 nsec. in duration and begins at 3.2 nsec. into the DUT period. That is, the leading edge is delayed from the beginning of the DUT period by 3.2 nsec. Of this 3.2 nsec., 0.2 nsec. results from the first phase shifter 22. The remaining 3.0 nsec. result from the fact that the leading-edge-memory values change after the first three entries, providing 1.0 nsec. of delay per entry. That is, the first three entries in the leading-edge memory 18 are the same, namely, zeros, while the fourth and subsequent entries are ones.

Since the first output pulse is to be 1.1 nanoseconds wide, the trailing edge must occur at $3.2+1.1=4.3$ nanoseconds after the beginning of the DUT period. Accordingly, the change in the contents of the trailing-edge memory 20 occurs after the fourth entry, and the second programmable phase shifter 24 is set to 300 psec.

In the second DUT period, the pulse begins at the same time as it did in the first DUT period, but it lasts only 2.1 nanosecond rather than 1.1 nanosecond. The transition in the leading-edge-memory contents therefore occurs after the third entry for the second DUT period, just as it occurred after the third entry for the first DUT period, but the transition in the trailing-edge-memory contents occurs after the fifth location rather than after the fourth location, as it did for the first DUT period.

While the information that determines the timing of the leading and trailing edges is determined by the transitions and delays of the individual leading- and trailing-edge memories, the data information is contained, not in the individual memory contents, but in the relationship between those contents. For example, the first illustrated output pulse is to be positive; that is, the signal starts at the low value, goes high, and then returns to low. To start out with a low value, the contents of the leading- and trailing-edge memories are the same so that the result of the XOR function is a low value. A change in the trailing-edge output causes the two outputs to be different so that the XOR output goes high, and the subsequent change in the output of the trailing-edge memory causes the two outputs to be the same again so that the XOR output returns to the low value.

In the second DUT period, the output signal is again to begin at the low level, but the DUT period starts with the outputs of the two memories high rather than low, as they were at the beginning of the previous DUT period. This illustrates that it is not the individual values of the memory contents that determine the tester output; it is the comparison of their values.

This is not a necessary feature of the present invention. For instance, the formatter could include a flip-flop rather than an XOR gate. However, I believe that the simplicity of the XOR-gate arrangement is advantageous since it contributes to the simplicity that distinguishes this invention.

It is clear that this arrangement provides considerable advantages over conventional tester architectures. For one thing, the formatter arrangement is extremely simple; there is no complicated circuitry for applying timing information; the timing is simply determined by the time at which the data are retrieved from memory. Moreover, the illustrated architecture greatly reduces the number of signals that must come from a central resource, since all address signals are generated in the individual pin electronics. This eliminates a major source of cross-talk. It also eliminates a large amount of "de-skewing" to insure that signals from a central resource all arrive at their respective destinations simultaneously. In the illustrated arrangement the clock is nearly the only signal that must be distributed from a central resource, and the clock is not required to reach all of the channels simultaneously; "de-skewing" is performed by the contents of the memories.

This highly decentralized architecture also allows a system to be expanded simply; addition of channels does not dictate a great amount of re-arrangement of central circuitry.

Additionally, this architecture provides great time-set flexibility. In most testers, including those of the present invention, the time within a given DUT period at which data are applied at a given pin is not in general the same as the data-application time at another pin for the same DUT period. The set of data-application times for all pins in the same DUT period is known as a time set, and conventional architectures, which set the time sets centrally, tend to restrict the number of different possible time sets in a given vector burst. Although the number of possible time sets obtainable with the architecture of the present invention does tend to be limited when DUT periods are very short, the present invention provides for a very large number of time sets when the DUT period is significantly longer than the shortest available tester clock period, and the data-application time can differ for every pin and every period if necessary.

Accordingly, the present invention constitutes a significant advance in the art.

I claim:

1. An apparatus, including apparatus terminals adapted for connection of an electronic circuit thereto, for applying signals to and/or sensing signals at the apparatus terminals, the apparatus comprising:
   A. a clock for generating a master clock signal comprising periodically occurring pulses; and
   B. a data/timing channel associated with each terminal, each channel comprising:
      i. a leading-edge memory and a trailing-edge memory, each given memory including an ordered plurality of memory locations, operable by application of respective individual clock signals thereto to produce, in response to the occurrence of each pulse in the respective individual clock signal, an output signal determined by the contents of the next location in the given memory and occurring at a time determined by the time of occurrence of the respective individual-clock-signal pulse; and
      ii. individual-clock-signal means responsive to the master clock signal for applying to the leading-edge memory and the trailing-edge memory a respective individual clock signal containing a pulse in response to each pulse in the master clock signal; and
      iii. a formatter connected to receive the outputs of the leading-edge and trailing edge memories for performing one of (a) applying to its respective terminal signal pulses whose leading edges are determined by the times of occurrence of transitions in the output of the leading-edge memory and whose trailing edges are determined by the times of occurrence of transitions in the output of the trailing-edge memory and (b) testing for the presence at the associated terminal, at points in a time determined by the times of occurrence of transitions in the leading-edge-memory and the trailing-edge-memory outputs, of signals having values determined by the leading-edge-memory and the trailing-edge-memory outputs.

2. An apparatus as defined in claim 1 wherein the individual-clock-signal means comprises a first programmable delay line associated with the leading-edge memory and a second programmable delay line associated with the trailing-edge memory, each of the first and second programmable delay lines being connected between its associated memory and the clock for applying to its associated memory an individual clock signal delayed from the master clock signal by a delay with which that delay line has been programmed.

* * * * *